United States Patent [19]

Iizawa

[11] 4,282,498
[45] Aug. 4, 1981

[54] CIRCUIT PACKAGE

[75] Inventor: Nobutsugu Iizawa, Minowa, Japan

[73] Assignee: Matsushima Kogyo Kabushiki Kaisha, Nagano, Japan

[21] Appl. No.: 77,519

[22] Filed: Sep. 20, 1979

[30] Foreign Application Priority Data

Sep. 22, 1978 [JP] Japan ................................ 53/117137

[51] Int. Cl.³ ........................ H03H 9/10; H03H 9/125
[52] U.S. Cl. .................................... 333/186; 310/340; 310/348; 333/200
[58] Field of Search ................................ 333/186–192, 333/197–198, 200, 201; 357/72; 331/154–159, 163, 116 R, 116 M, 68, 107 A, 187; 310/340, 344, 348, 351, 352, 353, 345, 349; 368/155, 159, 167

[56] References Cited

U.S. PATENT DOCUMENTS

| 3,969,640 | 7/1976 | Staudte | 310/344 X |
| 3,986,335 | 10/1976 | Harper | 357/72 X |
| 4,216,402 | 8/1980 | Engdahl | 310/344 X |
| 4,218,701 | 8/1980 | Shirasaki | 357/72 |

FOREIGN PATENT DOCUMENTS 2504552  1/1976  Fed. Rep. of Germany .......... 333/187

Primary Examiner—Marvin L. Nussbaum
Attorney, Agent, or Firm—Blum, Kaplan, Friedman, Silberman and Beran

[57] ABSTRACT

A circuit package wherein a framed resonator leaf is mounted in a recessed portion of a plastic body. The contours of the recess orient and support the resonator frame, and an electrically conductive adhesive both bonds the resonator frame to the body and electrically connects the resonator to lead electrodes embedded in the body. A circuit chip element electrically connected to the lead electrodes is also embedded in the body to provide an integral circuit package. A cover over the recess, bonded to the body, protects the resonator element. Welded connections and a resonator mounting plate are not used.

21 Claims, 7 Drawing Figures

CIRCUIT PACKAGE

BACKGROUND OF THE INVENTION

This invention relates generally to a circuit package of the type used on electronic circuit boards and more particularly to a circuit package for supporting and enclosing a resonator element. In prior art circuit packages for mounting resonator elements, a resonator leaf is supported on a specially machined mounting plate which is affixed to a substrate element and then encapsulated. It is not uncommon to also include in the encapsulated package a circuit chip associated with and wired to the resonator element so that a complete circuit package is provided for performing a function such as the generation of a high-frequency signal. Unfortunately, with this construction, there are variations in the Q-value and temperature characteristics of the resonator depending on the mounting position of the resonator leaf on the mounting plate and the degree of bonding between the plate and the leaf. A precision mounting plate is relatively costly to produce, and further, connecting of lead wires to the resonator and any circuit chips in the package is the cause of frequent breakage of the resonator leaf, deterioration of Q-value and variations in the temperature characteristics because of thermal shock and mechanical impact due to wire bonding. Also, the package body is frequently ceramic, which is expensive, and there are many manufacturing operations in the assembly of a completed circuit package of the prior art.

What is needed is a circuit package for containing a resonating element, said package being of simple and inexpensive construction which lends itself to mass production and results in a highly accurate reproducible product. It is desirable that the number of individual parts be minimized and the bonding of individual electrical connections be eliminated.

SUMMARY OF THE INVENTION

Generally speaking, in accordance with the invention, a circuit package for containing a resonator element which is simple in design and lends itself to economical mass production is provided. In the circuit package of this invention, a framed resonator leaf is mounted in a recessed portion of a plastic body. The contours of the recess orient and support the resonator frame, and an electrically conductive adhesive both bonds the resonator frame to the body and electrically connects to lead electrodes embedded in the body. A circuit chip element electrically connected to the lead electrodes is also embedded in the body to provide an integral circuit package. A cover over the recess, bonded to the body, protects the resonator element. Welded connections and a resonator mounting plate are not used. In an alternative design, a frame is bonded intermediate the body and the resonator element to allow for differences in thermal expansion coefficients between the resonator element and the body.

Accordingly, it is an object of this invention to provide an improved circuit package wherein a resonator element is precisely oriented and supported.

Another object of this invention is to provide an improved circuit package wherein a resonator is combined with a circuit chip element in an integral package.

A further object of this invention is to provide an improved circuit package wherein a resonator element is electrically connected without need for wire bonding.

Still another object of this invention is to provide an improved circuit package for a resonator circuit using a minimum number of component parts.

Yet another object of this invention is to provide an improved circuit package which has high Q-values and good temperature characteristics for a contained resonator element.

Another object of this invention is to provide an improved circuit package which is easily mass produced.

Still other objects and advantages of the invention will in part be obvious and will in part be apparent from the specification.

The invention accordingly comprises the features of construction, combination of elements, and arrangement of parts which will be exemplified in the construction hereinafter set forth, and the scope of the invention will be indicated in the claims.

BRIEF DESCRIPTION OF THE DRAWINGS

For a fuller understanding of the invention, reference is had to the following description taken in connection with the accompanying drawings, in which.

DESCRIPTION OF THE PREFERRED EMBODIMENTS

This invention relates to a circuit package integrally confining a circuit chip element and a resonator element in the same body, thereby providing a circuit component of high quality and using fewer component parts than prior art circuit packages of similar function. The circuit package of this invention is provided at a low unit cost and is easily and automatically assembled in mass production.

Figure 1:
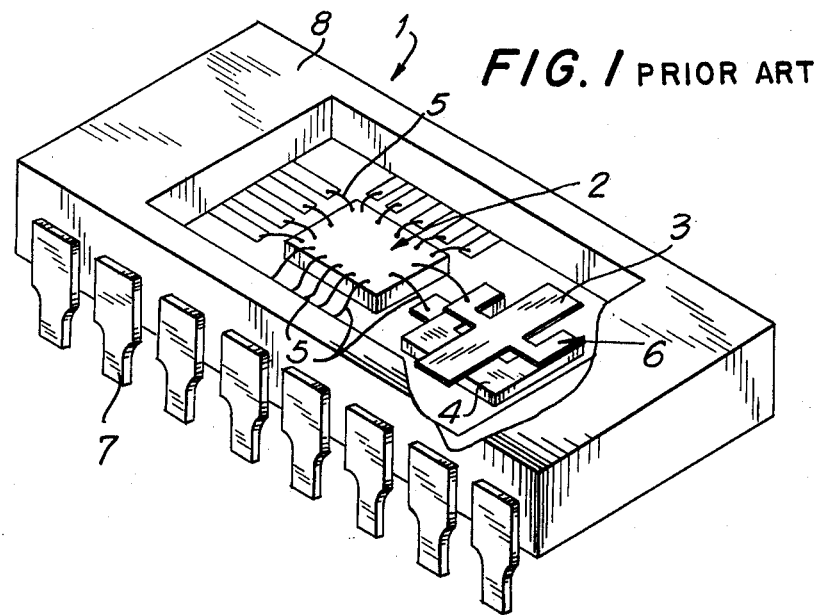
FIG. 1 is a perspective view to an enlarged scale, partially cut away, of a circuit package including a resonator element of the prior art.
Figure 4:
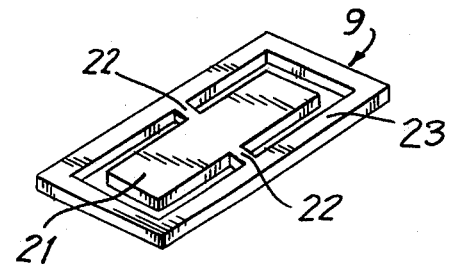
FIG. 4 is a perspective view to an enlarged scale of a resonator element for use with the circuit package of FIG. 2.

With reference to FIG. 1, a dual in-line package 1 (DIP) includes a mounted resonator element 6 and a circuit chip element 2 of the prior art in a state before encapsulation in a body 8 of ceramic material. A resonator leaf 3 and a mounting plate 4 compose the resonator element 6, and the mounting plate 4, which itself is supported on a horizontal surface of the body 8, supports the resonator leaf 3. Bonded lead wires 5 connect between the resonator 6 and the circuit chip element 2. The resonator element 6 and the circuit chip element 2 are also electrically connected by bonded lead wires 5 to output prong terminals 7 in the known manner. Signals supplied from the resonator element 6 are applied to the terminals 7 after processing through the circuit chip element 2. Thereby, for example, a plurality of different frequencies is outputted from selected terminals 7 as the circuit application requires.

Such a circuit package has the following deficiencies:

(1) Because the resonator leaf 3 is bonded to the mounting plate 4, variations of Q-value, temperature characteristics, etc. occur in the resonator element 6 dependent upon the accuracy of the mounting position and the degree of bonding between the plate 4 and resonator leaf 3.

(2) Because the mounting plate 4 has to be machined into a U-shape by using a numerical controller, cost of the component part is increased.

(3) Because the resonator leaf 3 and the circuit chip element 2 are electrically connected by bonded lead wires 5, breakage of the resonator leaf 3, deterioration of Q-value and variations in temperature characteristics of the resonator element 6, and similar effects are caused by the thermal shock and physical pressing which are used during wire bonding.

(4) Since the manufacture of conventional circuit packages requires many operational steps, for example, an operation to connect the mounting plate 4 to the body 8, an operation to bond the resonator leaf 3 to the mounting plate 4, an operation to connect the circuit element 2 and the resonator leaf 3 by wire bonding, and the like, a reduction in cost of production is virtually impossible.

(5) The ceramic body 8 generally used in prior art circuit packages is expensive and is a further obstacle to cost reduction.

The circuit package of this invention eliminates all the deficiencies described above. With reference to FIGS. 2-5, a DIP 30, that is, a dual in-line package, includes a steplike concave portion 11 which appears like an inverted rectangular pyramid depressed from the top surface 26 of the body 10. In the conventional manner, prongs 27 extend in parallel rows from both sides of the circuit package for insertion into registered receptacles in a circuit board (not shown). The package 30 further includes a cover 12 which provides a closure for the recess 11, and lead terminals 13 which provide electrical interconnection between the components of the package. A resonator element 9, located in the recess 11, comprises a resonator leaf 21 (FIG. 4) connected to a frame 23 through connecting arms 22. Because the resonator element 9 uses the frame 23 as a bonding surface, as described more fully hereinafter, positioning is facilitated for bonding the resonator element 9 in the steplike concave portion 11. This controlled positioning of the resonator 9 in the recess contributes to stabilization of the resonator's signal-generating operations. Surfaces of the resonator leaf would have conductive material deposited thereon for operation of the vibrator in a conventional manner. The conductive material would be led to selected positions on the surface of frame 22 facing lead terminals 13 for providing electrical connection to the resonator element.

Figure 2:
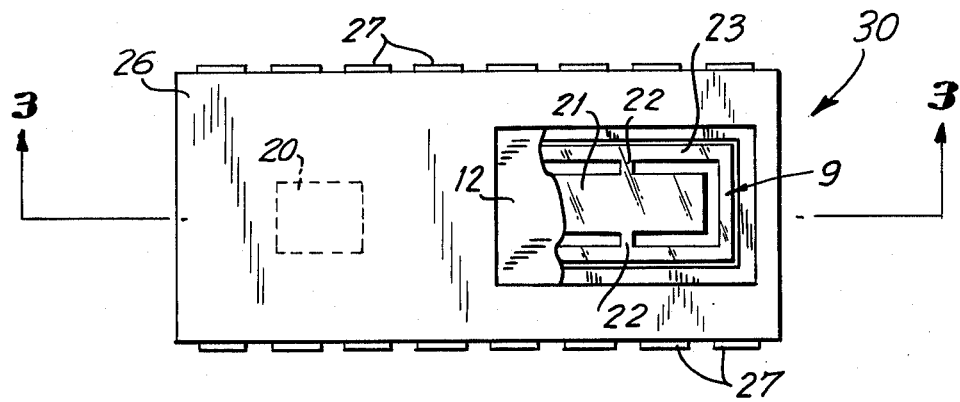
FIG. 2 is a plan view of a circuit package to an enlarged scale according to this invention, with portions cut away.
Figure 3:
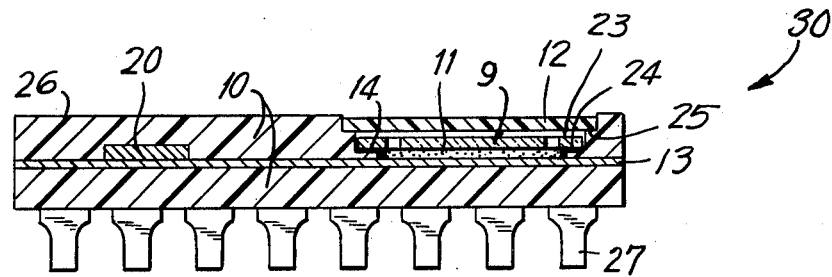
FIG. 3 is a sectional view taken along line 3—3 of FIG. 2.

As an example of a circuit package construction, a circuit chip element 20 is included in the illustrated package 30 of FIGS. 2 and 3. After bonding of the circuit chip element 20 to appropriate lead terminals 13, the body 10 is molded out of plastic, including the steplike concave portion 11, the bonded circuit chip element 20, prongs 27 and lead terminals 13. Then, the resonator element 9 is bonded to the lower-level peripheral surface 24 of the steplike concave portion 11 with a conductive adhesive material 14, and the cover 12 is sealed with an adhesive (not shown) to the upper-level peripheral surface 25 thereof. Silver paste or the like has been used as the conductive adhesive material 14 with satisfactory results. The resonator element 9 and lead terminals 13 are electrically connected through the adhesive material 14, which is electrically conductive. The resonator element 9 and cover 12 are made of materials in common usage for such resonator applications, e.g., quartz, lithium tantalate, etc. for the resonator 9, and glass, plastic, metal, etc. for the cover 12.

Figure 5:
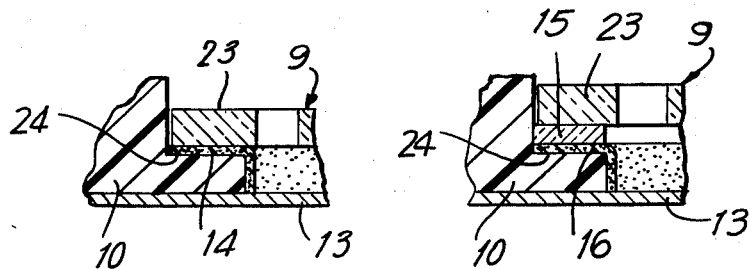
FIG. 5 is a fragment from FIG. 3 to a further enlarged scale.

FIG. 5 shows the bonding construction used in the embodiment of this invention illustrated in FIGS. 2 and 3. Note that the vertical wall 28 of the recess 11 encompasses the entire periphery of the resonator frame 23, thereby orienting the resonator element 9 in the body 10. The fit between the resonator frame 23 and the wall 28 allows for differences in thermal expansion without damage to the resonator element 9.

Figure 7:
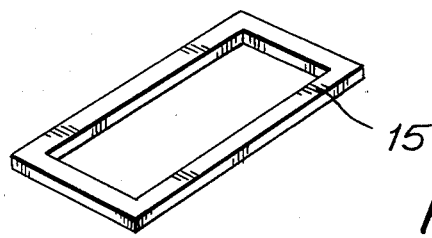
FIG. 7 is a perspective view of a frame member in the embodiment of FIG. 6.
Figure 6:
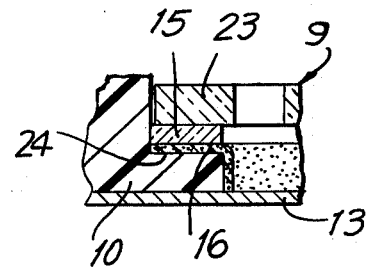
FIG. 6 is a view similar to FIG. 5, showing an alternative embodiment according to this invention.

FIG. 6 shows an alternative bonding construction used in an alternative embodiment of this invention, for example, to counteract stresses induced in the structure when the difference between thermal expansion coefficients of the resonator element 9 and the body 10 is large. A hollow frame 15 (FIG. 7) is positioned between the resonator element 9 and the lower level 24 of the steplike concave portion 11 of the body 10. The resonator element 9, the frame 15 and the body 10 are bonded together by means of an adhesive material 16, which is electrically conductive. The material for the hollow frame 15 is selected to adapt with the material of the resonator element 9 and may have the same thermal expansion coefficient as the resonator material.

The circuit package 30 in accordance with this invention has the following advantages. The resonator element 9 is bonded in the steplike concave portion 11, providing for mechanically unimpaired vibration of the resonator leaf 21. No mounting plate, such as plate 4 of FIG. 1, is required. Further, because accurate positioning for mounting of the resonator element 9 is facilitated by the cradling wall 28 in recess 11, variations of Q-value, temperature characteristics and the like of the resonator element are minimized.

The lead terminals 13 and the resonator element 9 are electrically connected by electrically conductive adhesive materials 14, 16. Since this electrical connection can be accomplished concurrently with the bonding of the resonator element 9 into the body 10 with conductive adhesive material, fewer operational steps are required. It should be understood that the lead electrodes 13 may be included in a pattern on a circuit board (not shown) enclosed in the body 10. In addition, bonding with conductive adhesive materials does not cause breakage of the resonator leaf 21 or deterioration of the Q-value and temperature characteristics or the like, defects in the prior art packages which have been caused by pressing or thermal shock during the process of wire bonding.

Also, a high-temperature heating process for fixing a mounting plate to the body (FIG. 1) is not required, since a mounting plate is not used in the embodiments according to this invention. Therefore, the use of plastic bodies, which are less expensive than bodies formed of other materials, is possible, and a low-priced circuit package is provided.

Only two manufacturing operations remain after the body 10 is molded into a configuration including the recess 11, namely, an operation to bond the resonator element 9 in the recess 11 and an operation to seal the cover 12 in place. Therefore, the number of manufacturing steps is reduced, whereby automated assembly becomes easily possible in mass production, and productivity is increased.

Thus, a circuit package 30 in accordance with this invention includes a resonator element 9 contained in a recess 11 which is contoured to provide both support and orientation for the resonator element. Circuit packages constructed according to this invention are applied to such products as standard pulse generators, one-shot timers and the like.

It should be readily apparent that in alternative embodiments of this invention, the frame 23 of the resonator element 9 need not extend entirely around the resonator leaf 21. Further, any type of resonator which is connected to a complete or partial peripheral frame, for example, a tuning-fork-type resonator element, may be mounted in a properly contoured steplike recess in the package body. Also, it should be apparent that in alternative embodiments of this invention, the resonator element may be square rather than rectangular, or it may be round or oval; in each case, the recess may be contoured to properly orient and support the resonator element along its peripheral frame.

In other alternative embodiments of this invention, the circuit package need not be a DIP. The recessed portion may be included, for example, in a flat pack or circular-plug-type circuit component. Although it is economical to provide a package having a plastic body, it should be understood that in alternative embodiments of this invention, the circuit package can be formed with a recess in a body which is ceramic, glass, metal, etc. or combinations thereof.

It will thus be seen that the objects set forth above, and those made apparent from the preceding description, are efficiently attained, and since certain changes may be made in the above construction without departing from the spirit and scope of the invention, it is intended that all matter contained in the above description or shown in the accompanying drawings shall be interpreted as illustrative and not in a limiting sense.

It is also to be understood that the following claims are intended to cover all of the generic and specific features of the invention herein described and all statements of the scope of the invention which, as a matter of language, might be said to fall therebetween.

What is claimed is:

1. A circuit package for electronic circuits comprising:
    a body, said body having a concave recess formed in a first surface thereof, said recess tapering inwardly in at least one step, said at least one step providing a first peripheral step surface within said body, said first step surface being spaced away from said first body surface; and
    a resonator element, said resonator element including a peripheral frame portion, said peripheral frame portion resting on said first peripheral step surface.

2. A circuit package as claimed in claim 1 and further comprising an adhesive, said adhesive bonding said resonator element to said step surface.

3. A circuit package as claimed in claim 2, wherein said adhesive is electrically conductive.

4. A circuit package as claimed in claim 3 and further comprising a cover element, said cover element being bonded to said body and enclosing said resonator element within said body.

5. A circuit package as claimed in claim 4, wherein said recess includes at least two steps providing at least two peripheral step surfaces, a step surface between said resonator element and said first body surface supporting said cover element.

6. A circuit package as claimed in claim 5, wherein the surfaces of said resonator frame and said first peripheral step surface are similar, whereby said resonator is substantially supported and bonded.

7. A circuit package as claimed in claim 6, wherein the outer periphery of said resonator frame substantially registers with the outer periphery of said first step peripheral surface, whereby said resonator element is oriented in said body.

8. A circuit package as claimed in claim 6, wherein said resonator frame surface and said first peripheral step surface are planar.

9. A circuit package as claimed in claim 3 and further comprising lead terminals, said lead terminals connecting electrically to said resonator element through said electrically conductive adhesive.

10. A circuit package as claimed in claim 9 and further comprising external terminals, said external terminals electrically connecting to said lead terminals.

11. A circuit package as claimed in claim 10 and further comprising a circuit chip element in combination with said body, said chip element being connected electrically with said resonator element and said external terminals through said lead terminals and said conductive adhesive.

12. A circuit package as claimed in claim 1, 3, 6 or 11, wherein said body is plastic, said recess being formed in said first surface thereof by molding.

13. A circuit package as claimed in claim 12, wherein said circuit chip element and said lead terminals are encapsulated in said body, said recess formation and said encapsulation being accomplished concurrently.

14. A circuit package as claimed in claim 3, 7 or 10 and further comprising a frame member, said frame member being supported on said first step surface, said resonator element being supported on said frame member, said electrically conductive adhesive bonding said resonator element to said frame member and said frame member to said first step surface.

15. A circuit package for electronic circuits comprising:
    a body, said body being formed by a molding operation;
    a circuit chip element, said chip element being encapsulated in said body during said molding operation;
    lead electrodes, said lead electrodes being encapsulated in said body during said molding operation, said lead electrodes being electrically connected to said circuit chip;
    a recess formed in said body during said molding operation, a portion of said lead electrodes being exposed inside said recess;
    a resonator leaf positioned within said recess and mechanically supported therein;
    an electrically conductive adhesive, said adhesive mechanically bonding said resonator leaf to said body within said recess and electrically connecting said resonator leaf to said exposed lead electrodes; and
    a cover element, said cover element being bonded to said body and enclosing said resonator leaf within said recess.

16. A circuit package as claimed in claim 15, wherein said body is plastic.

17. A circuit package as claimed in claim 3 or 15, wherein said conductive adhesive is silver paste.

18. A circuit package as claimed in claim 15, wherein said resonator leaf includes a peripheral frame portion and a vibrating portion, said recess being formed with a first step surface therein dimensioned to support said frame portion with said vibrating portion in spaced relation to said lead electrodes and said cover element.

19. A circuit package as claimed in claim 18, further comprising a frame member, said resonator leaf frame portions being supported on said frame member, said frame member being supported on said first step surface, said electrically conductive adhesive bonding said resonator leaf to said frame member and said frame member to said first step surface.

20. A circuit package for electronic circuits comprising:
a body, said body being formed by a molding operation;
a circuit chip element, said chip element being encapsulated in said body during said molding operation;
lead electrodes, said lead electrodes being encapsulated in said body during said molding operation, said lead electrodes being electrically connected to said circuit chip;
a recess formed in said body during said molding operation, a portion of said lead electrodes being exposed inside said recess;
a resonator element positioned within said recess and mechanically supported therein, said resonator element includes a peripheral frame portion and a vibrating portion, said recess being formed with a first step surface therein;
an electrically conductive adhesive, said adhesive mechanically bonding said resonator element to said body within said recess and electrically connecting said resonator element to said exposed lead electrodes; and
a cover element, said cover element being bonded to said body and enclosing said resonator element within said recess, said first step dimensioned to support said frame portion with said vibrating portion in spaced relation to said lead electrodes and said cover portion.

21. A circuit package as claimed in claim 20, further comprising a frame member, said resonator element frame portions being supported on said frame member, said frame member being supported on said first step surface, said electrically conductive adhesive bonding said resonator element to said frame member and said frame member to said first step surface.

* * * * *